United States Patent
Lee et al.

(10) Patent No.: US 8,165,645 B2
(45) Date of Patent: Apr. 24, 2012

(54) MOBILE COMMUNICATION TERMINAL CASE AND METHOD OF MANUFACTURING THE SAME

(75) Inventors: Byung Hwa Lee, Gyunggi-do (KR); Yong Won Yu, Gyunggi-do (KR); Hyun Sam Mun, Gyunggi-do (KR); Young Suk Kim, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 689 days.

(21) Appl. No.: 12/332,244

(22) Filed: Dec. 10, 2008

(65) Prior Publication Data

US 2010/0035671 A1    Feb. 11, 2010

(30) Foreign Application Priority Data

Aug. 5, 2008    (KR) .......................... 10-2008-0076483

(51) Int. Cl.
*H04M 1/00*        (2006.01)

(52) U.S. Cl. ..................... 455/575.1; 455/90.1; 455/550

(58) Field of Classification Search ............... 455/575.1, 455/550, 90.1, 90.3; 379/433.01, 433.13
See application file for complete search history.

(56) References Cited

U.S. PATENT DOCUMENTS

| | | | |
|---|---|---|---|
| 6,333,716 B1 | 12/2001 | Pontoppidan | |
| 6,370,362 B1 * | 4/2002 | Hansen et al. | 455/90.1 |
| 6,396,444 B1 | 5/2002 | Goward et al. | |
| 6,996,425 B2 * | 2/2006 | Watanabe | 455/575.1 |
| 7,283,853 B2 * | 10/2007 | Kanazawa et al. | 455/575.1 |
| 2002/0094838 A1 * | 7/2002 | Wang | 455/550 |

* cited by examiner

*Primary Examiner* — Jean B Jeanglaude
(74) *Attorney, Agent, or Firm* — Lowe, Hauptman, Ham & Berner, LLP

(57) ABSTRACT

There is provided a mobile communication terminal case including: a case body of a mobile communication terminal having a first surface and a second surface opposite to the first surface, and a via hole formed through the first surface and the second surface; a conductive pattern provided on the first surface of the case body; a carrier film provided on the first surface of the case body to cover the conductive pattern; and conductive epoxy filling the via hole and having one end thereof in contact with the conductive pattern.

10 Claims, 7 Drawing Sheets

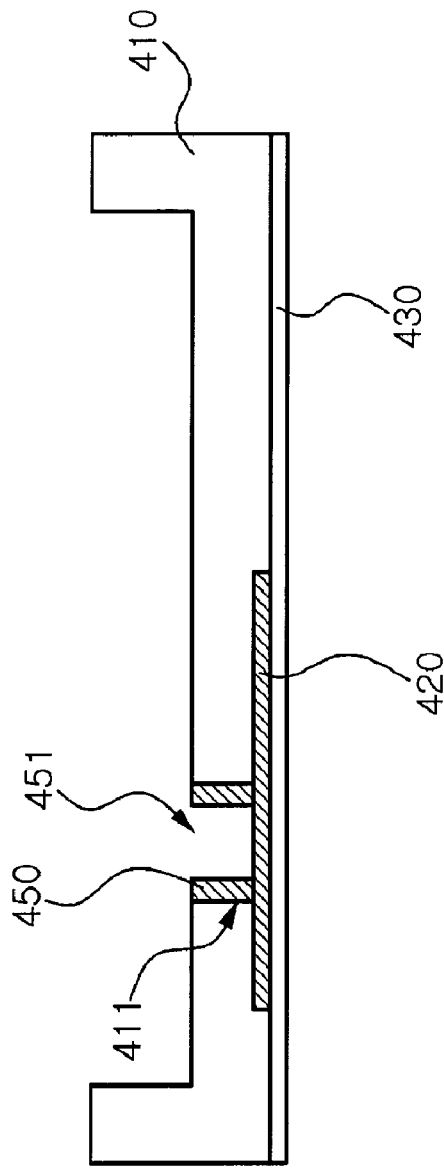
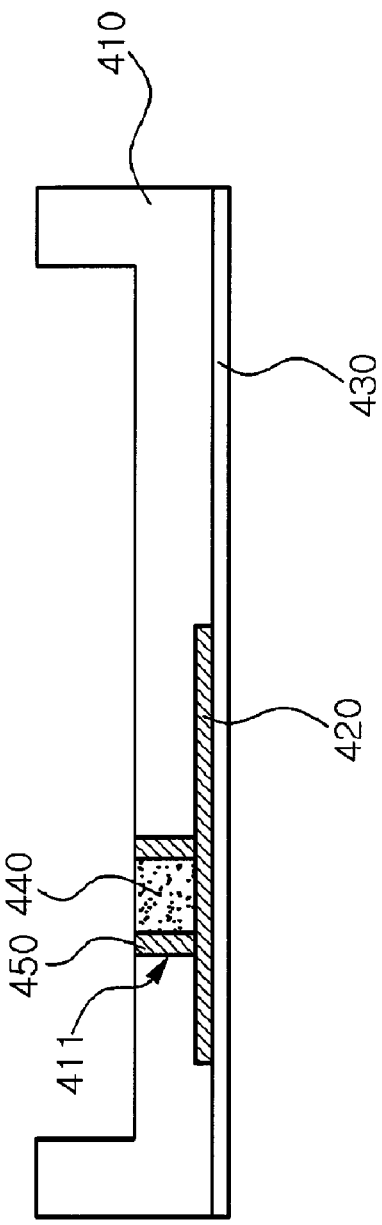

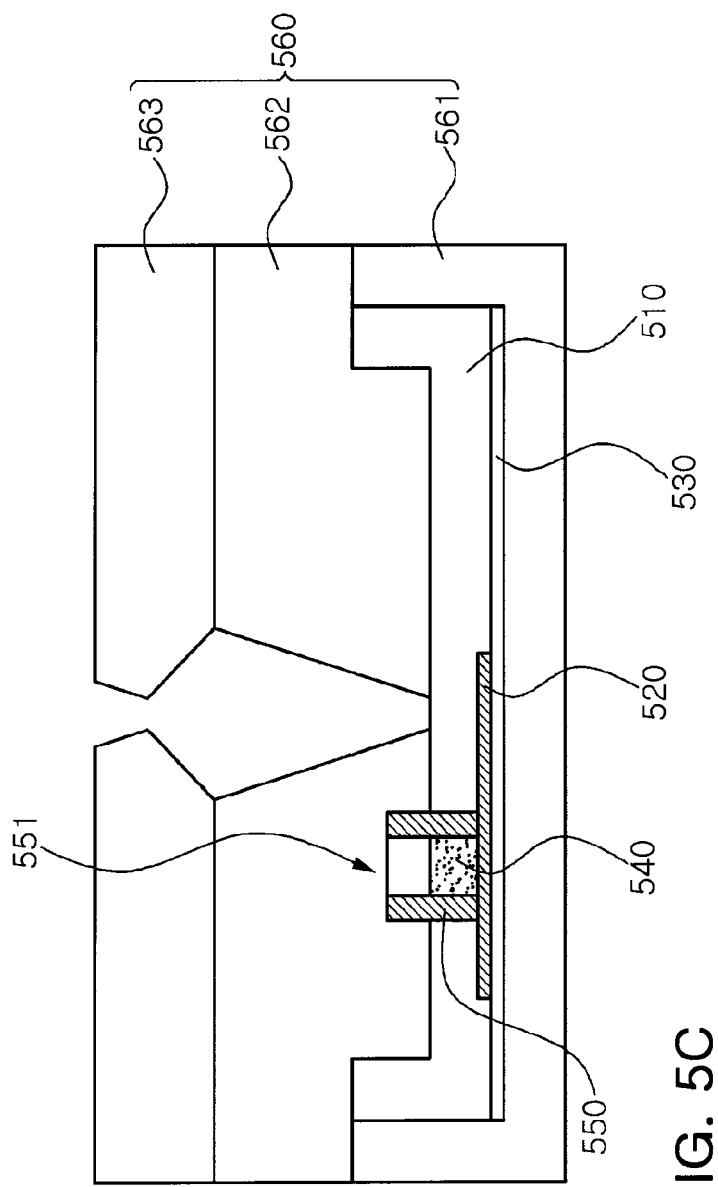
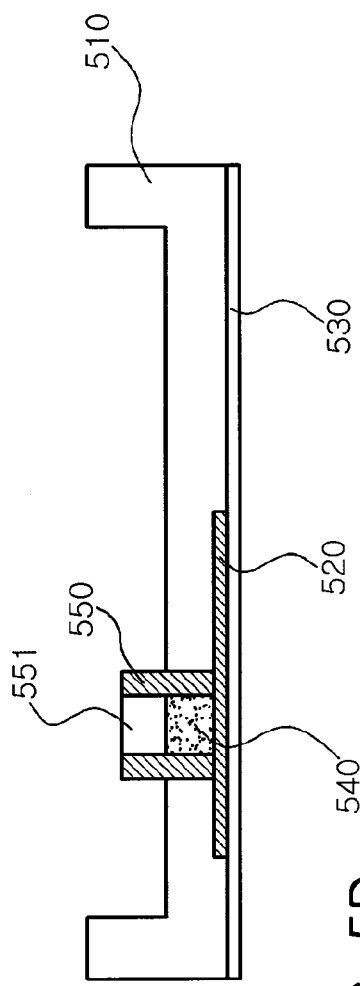
FIG. 5C
FIG. 5D

MOBILE COMMUNICATION TERMINAL CASE AND METHOD OF MANUFACTURING THE SAME

CROSS-REFERENCE TO RELATED APPLICATIONS

This application claims the priority of Korean Patent Application No. 2008-0076483 filed on Aug. 5, 2008, in the Korean Intellectual Property Office, the disclosure of which is incorporated herein by reference.

BACKGROUND OF THE INVENTION

1. Field of the Invention

The present invention relates to mobile communication terminal cases and methods of manufacturing the same, and more particularly, to a mobile communication terminal case having a structure to provide a stable connection between a film type antenna and a circuit board inside the case in a mobile communication terminal having a film type antenna formed integrally with the case thereof.

2. Description of the Related Art

Recently, as mobile wireless terminals that separately use various kinds of bandwidths, such as CDMA, PDA, DCS, and GSM, or use all of the bandwidths, have come into widespread use, terminals with various functions and designs have appeared. As the terminals have gradually been reduced in size, thickness, and weight, the diversity of the functions of the terminals has attracted attention. Therefore, emphasis is placed on reducing the volume of the terminals while the terminals maintain the function of an antenna.

Particularly, in a case of an antenna, for example, a rod antenna or a helical antenna that protrudes from the outside of a terminal by a predetermined length has excellent characteristics because of omnidirectional radiation. However, the rod antenna or the helical antenna of the terminal is most susceptible to damage when it falls down, and reduces portability. Therefore, research has been conducted on an in-molding antenna that is formed integrally with a case of a mobile communication terminal.

SUMMARY OF THE INVENTION

An aspect of the present invention provides a mobile communication terminal having a structure to provide a stable contact between a film type antenna formed on a case of the mobile communication terminal and a printed circuit board inside the case.

According to an aspect of the present invention, there is provided a mobile communication terminal case including: a case body of a mobile communication terminal having a first surface and a second surface opposite to the first surface, and a via hole formed through the first surface and the second surface; a conductive pattern provided on the first surface of the case body; a carrier film provided on the first surface of the case body to cover the conductive pattern; and conductive epoxy filling the via hole and having one end thereof in contact with the conductive pattern.

The mobile communication terminal case may further include a conductive via provided in the via hole and in contact with the conductive epoxy.

The conductive via may include a cylindrical shape having an opening therein.

The conductive via may be in direct contact with the conductive pattern.

According to another aspect of the present invention, there is provided a method of manufacturing a mobile communication terminal case, the method including: forming a conductive pattern on a carrier film; locating the carrier film having the conductive pattern formed thereon inside a mold shaped like a mobile communication terminal case, and injecting a molding material into the mold to form a case body of the mobile communication terminal having the conductive pattern formed on one surface thereof and a via hole connected to the conductive pattern; and injecting conductive epoxy into the via hole of the case body of the mobile communication terminal.

The method may further include forming a conductive via in the via hole before injecting the conductive epoxy.

The conductive via may include a cylindrical shape having an opening therein.

According to still another aspect of the present invention, there is provided a method of manufacturing a mobile communication terminal case, the method including: forming a conductive pattern on a carrier film; connecting a conductive via to the conductive pattern by using conductive epoxy; and locating the carrier film having the conductive pattern and the conductive via connected to the conductive pattern inside a mold shaped like a mobile communication terminal case, and injecting a molding material into the mold to form a case body of the mobile communication terminal, wherein the conductive pattern is formed on one surface of the case body of the mobile communication terminal, and the conductive via having one end connected to the conductive pattern is exposed to the other surface of the case body of the mobile communication terminal.

The conductive via may include a cylindrical shape having an opening therein.

The method may further include filling the opening of the conductive via with conductive epoxy after forming the case body of the mobile communication terminal.

BRIEF DESCRIPTION OF THE DRAWINGS

The above and other aspects, features and other advantages of the present invention will be more clearly understood from the following detailed description taken in conjunction with the accompanying drawings, in which:

FIGS. 4A through 4D are cross-sectional views sequentially illustrating a method of manufacturing a mobile communication terminal case according to another exemplary embodiment of the invention; and FIGS. 5A through 5D are cross-sectional views sequentially illustrating a method of manufacturing a mobile communication terminal case according to still another exemplary embodiment of the invention.

DETAILED DESCRIPTION OF THE PREFERRED EMBODIMENT

Exemplary embodiments of the present invention will now be described in detail with reference to the accompanying drawings.

Figure 1:
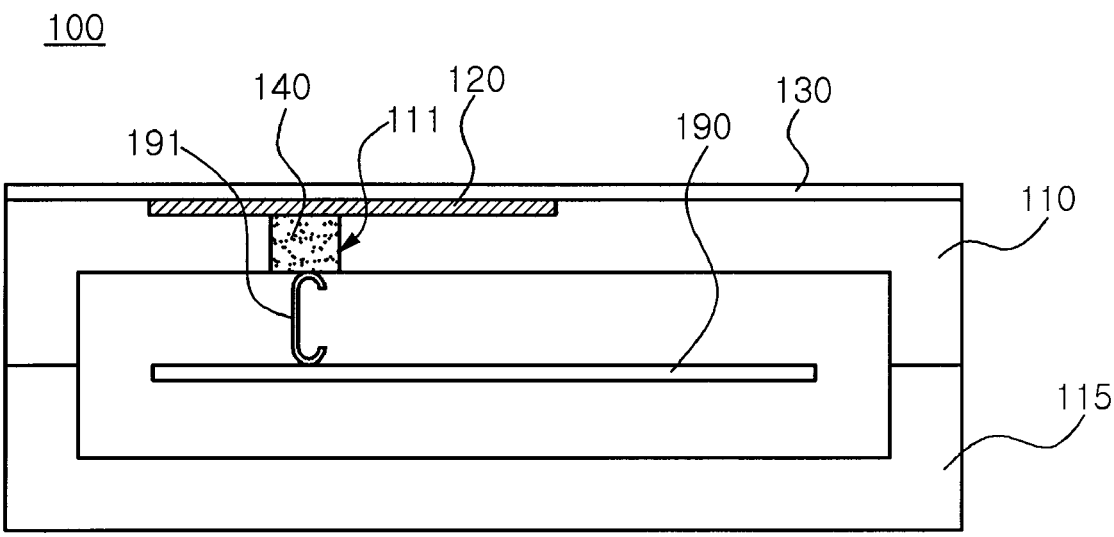
FIG. 1 is a cross-sectional view illustrating a mobile communication terminal case according to an exemplary embodiment of the invention.

FIG. 1 is a cross-sectional view illustrating a mobile communication terminal case according to an exemplary embodiment of the invention.

Referring to FIG. 1, a mobile communication terminal case 100 according to an exemplary embodiment of the invention may include a case body 110, a conductive pattern 120, a carrier film 130, and conductive epoxy 140.

The case body 110 may be coupled with another case body 115 to form a case of a mobile communication terminal. A printed circuit board 190 onto which various elements are mounted may be disposed inside the case of the mobile communication terminal.

The case body 110 may have a first surface and a second surface that face each other. The first surface may be an outer surface of the case of the mobile communication terminal, and the second surface may be an inner surface of the case of the mobile communication terminal.

The case body 110 of the case of the mobile communication terminal may be formed by using an in-molding process. That is, the carrier film 130 on which the conductive pattern 120 is formed is inserted into a mold used for manufacturing the case, and synthetic resin used to form the case is injected into the mold, thereby manufacturing the case. In this embodiment, when the carrier film 130 may be formed on the surface of the case body 110, the carrier film 130 is formed integrally with the case body 110.

In this embodiment, the carrier film 130 may be formed on the outer surface of the case body 110. The conductive pattern 120 may be located between the case body 110 and the carrier film 130.

The case body 110 may have a variety of shapes. In this embodiment, a via hole 111 that is formed through the inner surface and the outer surface of the case body 110 may be formed. The via hole 111 is filled with a conductive material so as to serve as a path through which the conductive pattern 120 is electrically connected to the printed circuit board 190 located inside the case.

The conductive pattern 120 and the carrier film 130 may be formed on the outer surface of the case body 110.

The conductive pattern 120 may be an antenna pattern that is formed on one surface of the carrier film 130. The conductive pattern 120 may be formed by using various kinds of methods. First, a conductive pattern may be printed onto the carrier film 130 by using conductive ink. Alternatively, a desired pattern may be directly formed on the carrier film by sputtering or evaporation. The conductive pattern 120 may be formed of previously manufactured metal foil which is then attached to the carrier film 130.

The conductive pattern 120 includes a power feeding terminal, and may additionally include a connection terminal to provide an electrical connection to an external circuit, such as a ground terminal. In this embodiment, the power feeding terminal may be a contact area where the conductive pattern 120 is in contact with the conductive epoxy 140.

The carrier film 130 may be formed of a material that is appropriate to perform in-molding labeling (IML). Specifically, the carrier film 130 that has the conductive pattern 120 formed on one surface thereof is inserted into the mold for manufacturing the case of the mobile communication terminal, synthetic resin used to form the case of the mobile communication terminal is injected into the mold, and the case is molded from the synthetic resin at optimum temperature and optimum pressure. Therefore, the material that forms the carrier film 130 needs to be a material that does not undergo significant deformation under the pressure and temperature during the in-molding labeling, and at the same time, can be formed integrally with the case of the mobile communication terminal. In this embodiment, the carrier film 130 may include a thin, insulating polymer material.

The via hole 111 formed in the case body 110 may be filled with the conductive epoxy 140. The via hole 111 may be a path through which the conductive pattern 120 formed on the outer surface of the case body 110 is electrically connected to the printed circuit board 190 disposed inside the case body 110. A separate connector may be inserted into the via hole 111 to thereby connect the conductive pattern 120 and the printed circuit board 190 to each other. However, the connector may damage the conductive pattern 120 and the carrier film 130 formed on the outside of the case body 110 or spoil the appearance of the case.

Further, plating may be performed on the via hole 111 so that the conductive pattern 120 and the printed circuit board 190 can be electrically connected to each other. However, a stable contact between the via hole 111 and the conductive pattern 120 may be limited.

In this embodiment, the via hole 111 may be filled with conductive epoxy. Here, conductive epoxy in a liquefied state fills the via hole 111, and then, the liquefied conductive epoxy may be cured. This can enhance a physical bond between the conductive epoxy 140 and the conductive pattern 120 as compared with the plated via hole 111. That is, the cured conductive epoxy 140 and the conductive pattern 120 do not simply make a mechanical contact therebetween. However, since the cured conductive epoxy 140 serves as a kind of adhesive, the cured conductive epoxy 140 and the conductive pattern 120 can be bonded to each other. The cured conductive epoxy may have predetermined elasticity. Therefore, even when a connector 191 is used for connection to the printed circuit board 190, the cured conductive epoxy 140 can serve as a buffer to protect the conductive pattern 120 and the carrier film 130.

Figure 2:
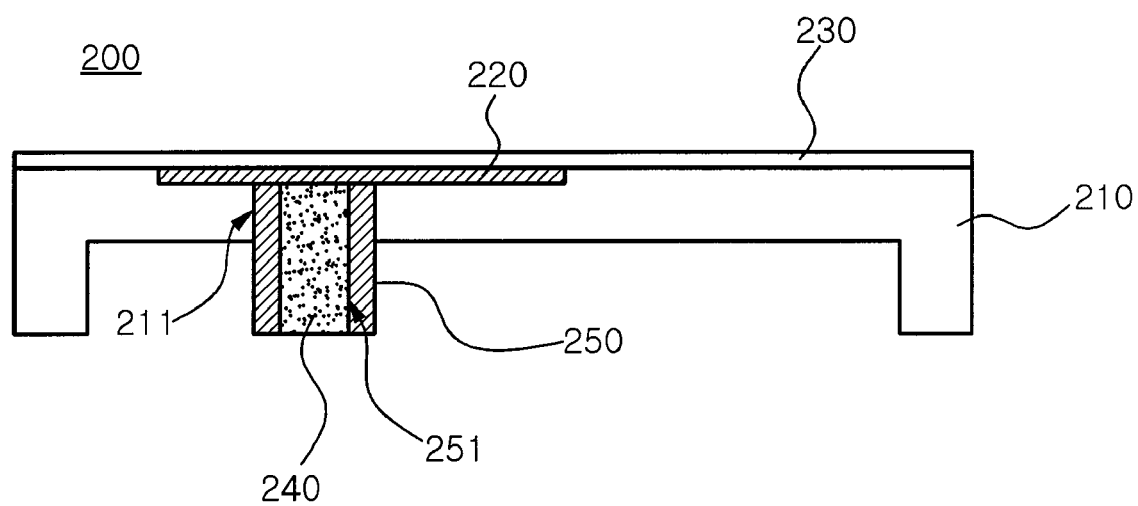
FIG. 2 is a cross-sectional view illustrating a mobile communication terminal case according to another exemplary embodiment of the invention.

FIG. 2 is a cross-sectional view illustrating a mobile communication terminal case according to another exemplary embodiment of the invention.

Referring to FIG. 2, a mobile communication terminal case 200 according to this embodiment may include a case body 210, a conductive pattern 220, a carrier film 230, conductive epoxy 240, and a conductive via 250.

The case body 210 may be coupled to another case body (not shown) to form a case of the mobile communication terminal. A printed circuit board (not shown) onto which various elements are mounted may be disposed in the case of the mobile communication terminal.

The case body 210 may have a first surface and a second surface that face each other. The first surface may be an outer surface of the case of the mobile communication terminal, and the second surface may be an inner surface of the case of the mobile communication terminal.

The case body 210 of the case of the mobile communication terminal may be formed by using an in-molding process. That is, the carrier film 230 on which the conductive pattern 220 is formed is inserted into a mold for manufacturing the case, and synthetic resin used to form the case is injected, thereby manufacturing the case. In this embodiment, as the carrier film 230 may be formed on the surface of the case body so that the carrier film 230 is formed integrally with the case body 210.

In this embodiment, the carrier film 230 may be formed on the outer surface of the case body 210. The conductive pattern 220 may be located between the case body 210 and the carrier film 230.

The case body 210 may have various shapes. In this embodiment, a via hole 211 may be formed through the inner surface and the outer surface of the case body 210. The conductive pattern 220 may be electrically connected to the printed circuit board disposed inside the case by filling the via hole 211 with a conductive material or inserting a conductive material therein.

The conductive pattern 220 and the carrier film 230 may be formed on the outer surface of the case body 210.

The conductive pattern 220 may be an antenna pattern that is formed on one surface of the carrier film 230. The conductive pattern 220 may be formed by using various kinds of methods. First, a conductive pattern may be printed on the carrier film 230 by using conductive ink. Alternatively, a desired pattern may be directly on the carrier film by sputtering or evaporation. The conductive pattern 220 may be formed of previously metal foil which is then attached to the carrier film 230.

The conductive pattern 220 includes a power feeding terminal, and may additionally include a connection terminal to provide an electrical connection to an external circuit, such as a ground terminal. In this embodiment, the power feeding terminal may a contact area where the conductive pattern 120 is in contact with the conductive epoxy 240.

The carrier film 230 may be formed of a material that is appropriate to perform in-molding labeling (IML). Specifically, the carrier film 230 that has the conductive pattern 220 formed on one surface thereof is inserted into the mold for manufacturing the case of the mobile communication terminal, synthetic resin used to form the case of the mobile communication terminal is injected into the mold, and the case is molded from the synthetic resin at optimum temperature and optimum pressure. Therefore, the material that forms the carrier film 230 needs to be a material that does not undergo significant deformation under the pressure and temperature during the in-molding labeling, and at the same time, can be formed integrally with the case of the mobile communication terminal. In this embodiment, the carrier film 230 may include a thin, insulating polymer material.

The conductive via 250 may be formed in the via hole 111 in the case body 210. The conductive via 250 may be formed to have a length so that one end of the conductive via 250 is in contact with the conductive pattern 220 and the other end thereof is in contact with a printed circuit board disposed inside the case of the mobile communication terminal. Therefore, the conductive via 250 may have a larger thickness than the case body 210.

The conductive via 250 may be formed into a cylindrical shape with an opening 251. When a conductive via is formed in a cylindrical shape with an opening, an additional connector is not required unlike the embodiment illustrated in FIG. 1. That is, the conductive via may be high enough to make contact with the printed circuit board in the case body 210. The conductive via may have a variety of shapes. The conductive via also may have one end in contact with the conductive pattern and the other end exposed to the outside of the case body.

The opening 251 of the conductive via 250 may be filled with the conductive epoxy 240. The via hole may be filled with conductive epoxy in a liquefied state, and then, the conductive epoxy may be cured. The conductive via 250 and the conductive pattern 220 may make mechanical contact, but the stability of the contact may be reduced. Like this embodiment, when the opening 251 is filled with the conductive epoxy 240, the conductive epoxy 240 is cured, and the cured conductive epoxy 240 may serve as an adhesive between the conductive via 250 and the conductive pattern 220. When the conductive epoxy 240 fills the opening 251, the conductive epoxy 240 may fill the opening 251 up. When the conductive via simply has one end in contact with the conductive pattern and the other end exposed to the outside of the case body, the conductive epoxy can serve as an adhesive to increase a bonding force between the conductive via and the conductive pattern.

Figure 3A:
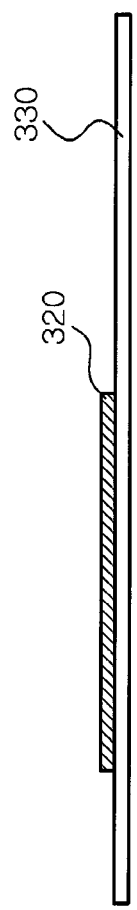
FIGS. 3A through 3C are cross-sectional views sequentially illustrating a method of manufacturing a mobile communication terminal case according to an exemplary embodiment of the invention.
Figure 3B:
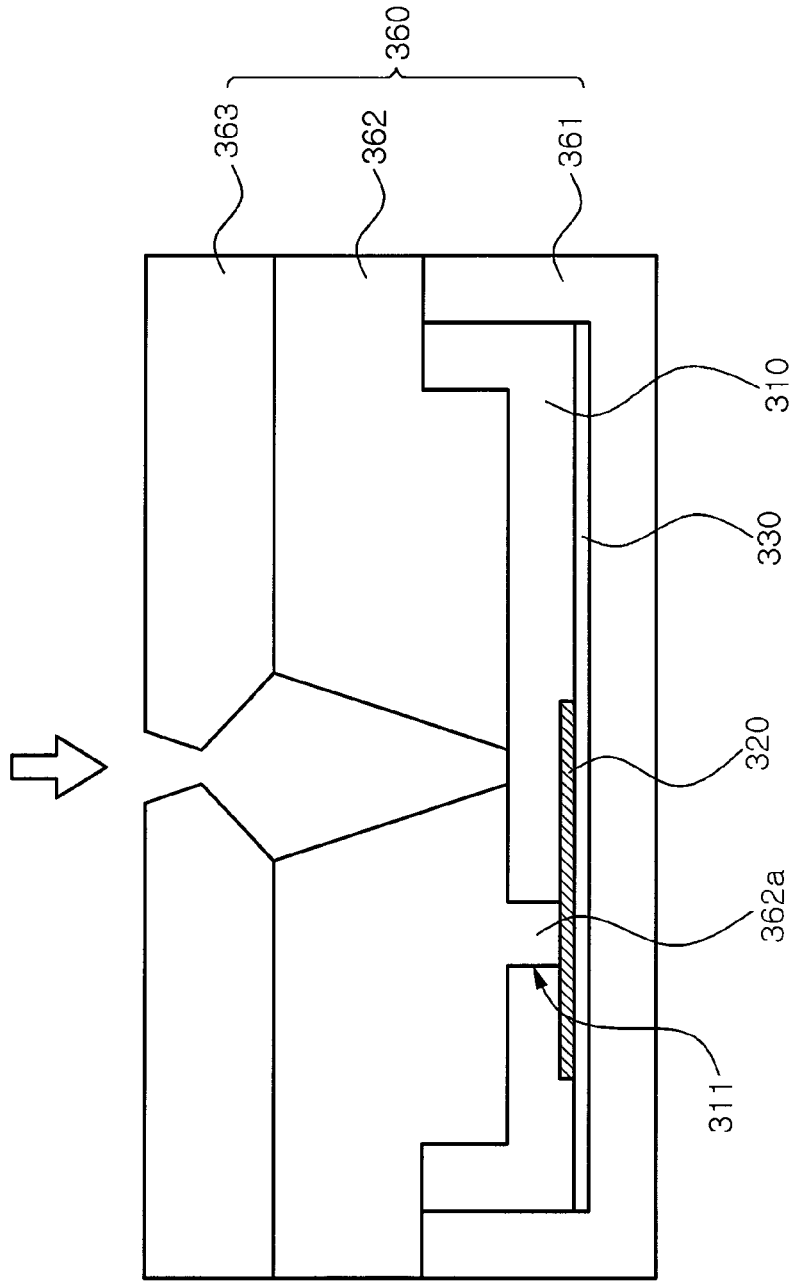
Figure 3C:
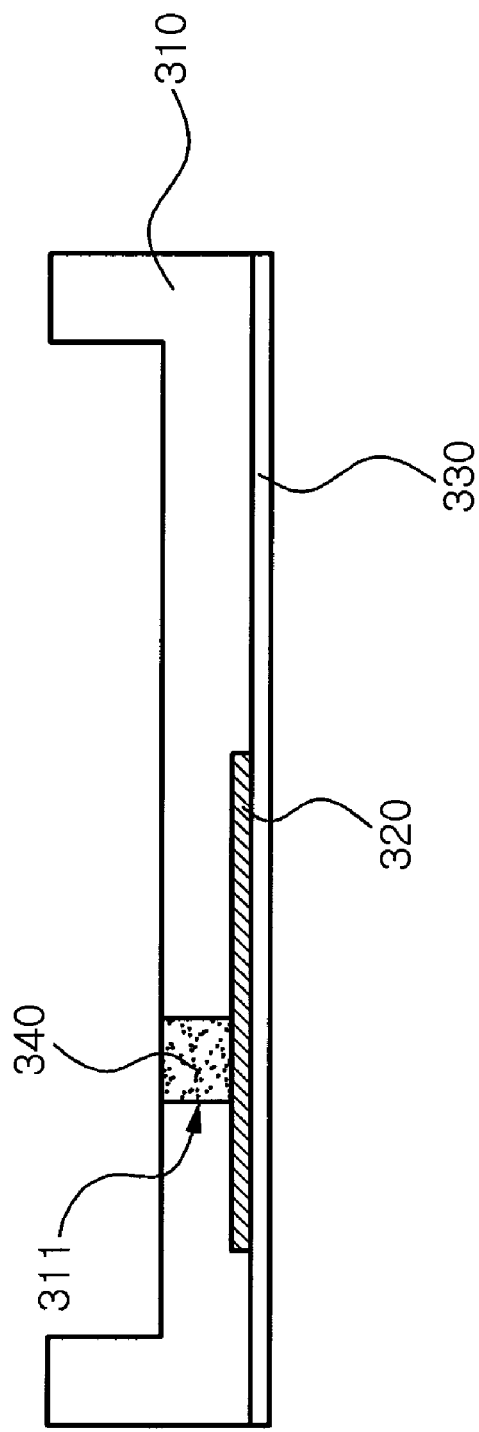

FIGS. 3A through 3C are cross-sectional views sequentially illustrating a method of manufacturing a mobile communication terminal case according to an exemplary embodiment of the invention.

In FIG. 3A, the conductive pattern 320 is formed on the carrier film 330.

The carrier film 330 has an antenna pattern on one surface or antenna patterns on both surfaces thereof. For the in-molding process, the carrier film 330 having the antenna pattern thereon is inserted into the mold. Therefore, the carrier film 330 needs to be formed of a material that does not undergo significant deformation under the pressure and temperature during the in-molding process, and at the same time, can be formed integrally with the case of the mobile communication terminal. Preferably, the carrier film may be formed of a thin, insulating polymer material.

The conductive pattern 320 may be formed by using various kinds of methods. First, a conductive pattern may be printed onto the carrier film 330 by using conductive ink. Alternatively, a desired pattern may be directly formed on the carrier film by sputtering or evaporation. The conductive pattern 320 may be formed of previously manufactured metal foil which is then attached to the carrier film 330.

In this embodiment, the conductive pattern 320 is formed on one surface of the carrier film 330. Conductive patterns may be formed on both surfaces of the carrier film 330. Here, the conductive patterns formed on both surfaces of the carrier film are symmetrical with each other to form a balanced antenna.

In FIG. 3B, the carrier film having the conductive pattern thereon is inserted into the mold for manufacturing the case of the mobile communication terminal, and a molding material is injected into the mold, thereby forming the case body of the terminal.

Referring to FIG. 3B, the carrier film 330 having the conductive pattern 320 formed thereon may be inserted into the mold 360. The mold 360 may include a first part 361, a second part 362, and a third part 363. The first part 361 is in contact with the carrier film 330 and forms a lower surface of the mold. A molding material is injected into the second part 362, which forms an upper surface of the mold. The third part 363 is connected to a storage unit containing the molding material through a nozzle. The carrier film 330 is inserted between the first part 361 and the second part 362 of the mold. The conductive pattern 320 formed on the carrier film may be disposed in direct contact with the molding material during the molding process.

All of the components of the mold are coupled with each other, and the molding material is injected into the mold 360 through the nozzle under a predetermined pressure. The molding material may be formed of a polymer-based material to form the terminal case. The molding material injected into the mold fills the space between the second part 362 and the first part 361 of the mold.

In this embodiment, the via hole 311 may be formed in a case body 310 of the mobile communication terminal. Therefore, a protrusion 362a for forming the via hole may be formed on the second part 362 of the mold 360.

A cooling process and a curing process are performed after a compressing process of the mold 360, such that the case body 310 of the mobile communication terminal that has the conductive pattern 320 on one surface thereof and having the via hole 311 can be formed.

In FIG. 3C, conductive epoxy fills the via hole 311 formed in the case body 310 of the terminal.

The conductive epoxy 340 may serve as an electrical path through which the conductive pattern 320 formed on the outer surface of the case body 310 of the terminal is connected to the printed circuit board disposed inside the case body 310 of the terminal.

FIGS. 4A through 4D are cross-sectional views sequentially illustrating a method of manufacturing a mobile communication terminal case according to another exemplary embodiment of the invention.

Figure 4A:
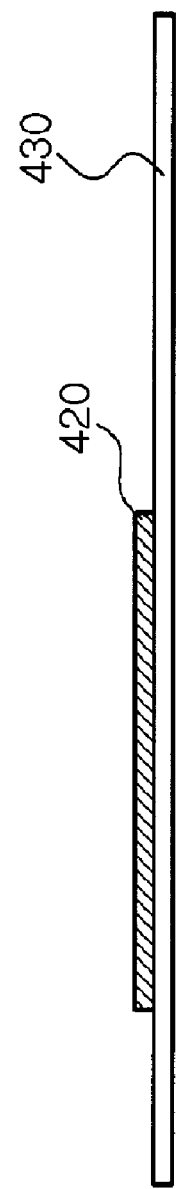

In FIG. 4A, a conductive pattern 420 is formed on a carrier film 430.

The carrier film 430 has an antenna pattern on one surface thereof or antenna patterns on both surfaces thereof, and is inserted into a mold to perform an in-molding process. Therefore, the carrier film 430 needs to be formed of a material that does not undergo significant deformation under the pressure and temperature during the in-molding labeling, and at the same time, can be formed integrally with the case of the mobile communication terminal. Preferably, the carrier film 430 may include a thin, insulating polymer material.

The conductive pattern 420 may be formed by using various kinds of methods. First, the conductive pattern may be printed onto the carrier film 430 by using conductive ink. Alternatively, a desired pattern may be directly formed on the carrier film by sputtering or evaporation. The conductive pattern 420 may be formed of previously manufactured metal foil which is then attached to the carrier film 430.

In this embodiment, the conductive pattern 420 is formed on one surface of the carrier film 430. However, conductive patterns may be formed on both surfaces of the carrier film 430. Here, the conductive patterns formed on both surfaces of the carrier film may be symmetrical with each other to form an antenna having a balanced structure.

Figure 4B:
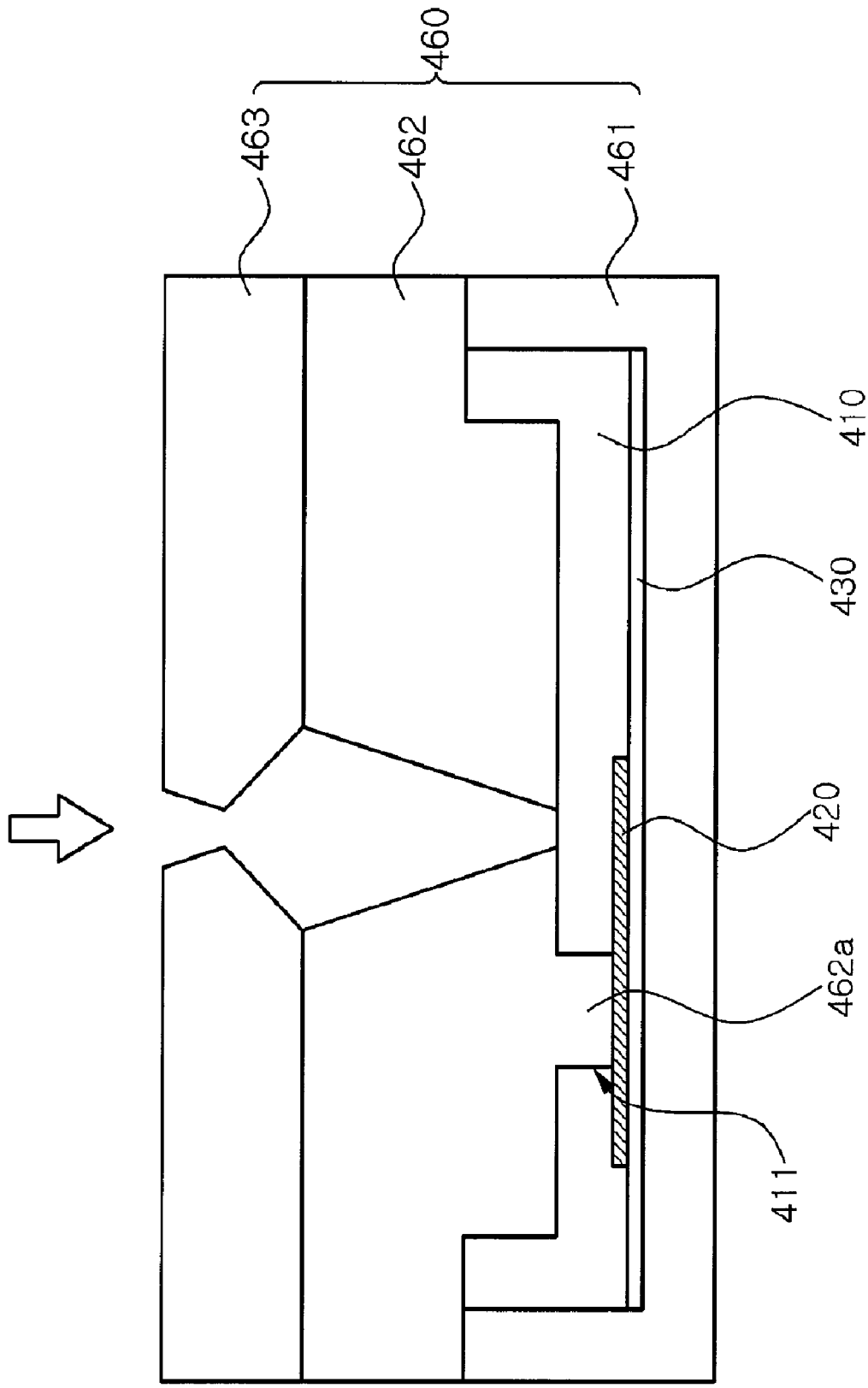

In FIG. 4B, the carrier film 430 having the conductive pattern 420 thereon is inserted into the mold for manufacturing the case of the mobile communication terminal, and a molding material is injected into the mold, thereby manufacturing the body of the terminal case.

Referring to FIG. 4B, the carrier film 430 having the conductive pattern 420 formed thereon may be inserted into a mold 460. The mold 460 may include a first part 461, a second part 462, and a third part 463. The carrier film 430 is in contact with the carrier film 430 and forms a lower surface of the mold. A molding material is injected into the second part 462, which forms an upper surface of the mold. The third part 430 is connected to a storage unit containing the molding material through a nozzle. The carrier film 430 is inserted between the first part 461 and the second part 462 of the mold. The conductive pattern 420 formed on the carrier film may be arranged in direct contact with the molding material.

All of the components of the mold are coupled to each other. The molding material is injected into space of the mold 460 under a predetermined pressure. The molding material may be a polymer-based material. The molding material injected into the mold fills the space between the first part 461 and the second part 462.

In this embodiment, the via hole 411 may be formed in a case body 410 of the mobile communication terminal. Therefore, a protrusion 462a for forming the via hole may be formed on the second part 462 of the mold 460.

A cooling process and a curing process are performed after a compressing process of the mold 460, such that the case body 410 of the mobile communication terminal that has the conductive pattern 420 formed on one surface thereof and the via hole 411 formed therein can be formed.

In FIG. 4C, a conductive via 450 is formed in the via hole 411 formed in the case body 410 of the case of the mobile communication terminal.

In this embodiment, the conductive via 450 may have a cylindrical shape with an opening 451. The conductive via 450 may have one end connected to the conductive pattern 420 and the other end exposed to an inner surface of the case body 410.

The conductive via 450 may have various shapes. The conductive via is simply a connector, is formed in the via hole 411, and may serve as a path through which the conductive pattern 420 and the printed circuit board are connected to each other.

In FIG. 4D, conductive epoxy fills the via hole 411 of the case body. The conductive epoxy 440 may be filled to make contact with the conductive via 450 and the conductive pattern 420.

In this embodiment, since the conductive via 450 having a cylindrical shape is formed in the via hole 411, the conductive epoxy may fill the opening 451 of the conductive via.

In this embodiment, the conductive via 450 formed in the via hole 411 may used as a main path through which the conductive pattern 420 can be connected to the printed circuit board. The conductive epoxy 440 serves as an adhesive to enhance a physical bond between the conductive via 450 and the conductive pattern 420.

FIGS. 5A through 5D are cross-sectional views sequentially illustrating a method of manufacturing a mobile communication terminal case according to still another exemplary embodiment of the invention.

Figure 5A:
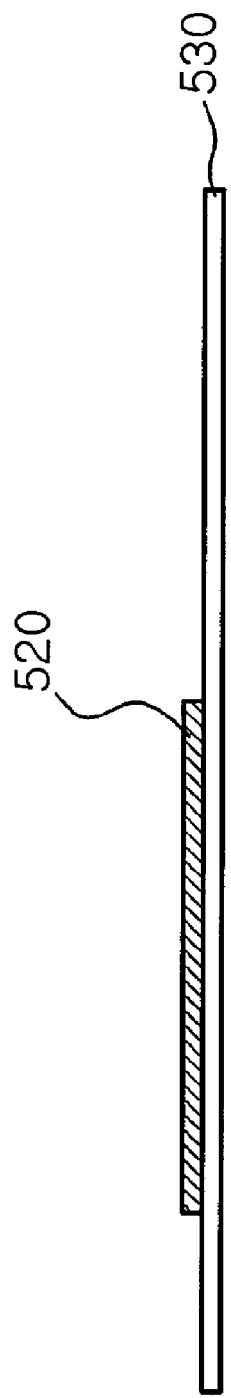

In FIG. 5A, a conductive pattern 520 is formed on a carrier film 530.

The carrier film 530 has an antenna pattern on one surface thereof or antenna patterns on both surfaces thereof, and is inserted into a mold to perform an in-molding process. Therefore, the carrier film 530 needs to be a material that does not undergo significant deformation under the pressure and temperature during the in-molding labeling, and at the same time, can be formed integrally with the case of the mobile communication terminal. Preferably, the carrier film may include a thin, insulating polymer material.

The conductive pattern 520 may be formed by using various kinds of methods. First, a conductive pattern may be printed onto the carrier film 530 by using conductive ink. Alternatively, a desired pattern may be directly formed on the carrier film by sputtering or evaporation. The conductive pattern 520 may be formed of previously manufactured metal foil which is then attached to the carrier film 530.

In this embodiment, the conductive pattern 520 is formed on one surface of the carrier film 530. However, conductive patterns may be formed on both surfaces of the carrier film 530. Here, the conductive patterns formed on the carrier film may be symmetrical with each other to form an antenna having a balanced structure.

Figure 5B:
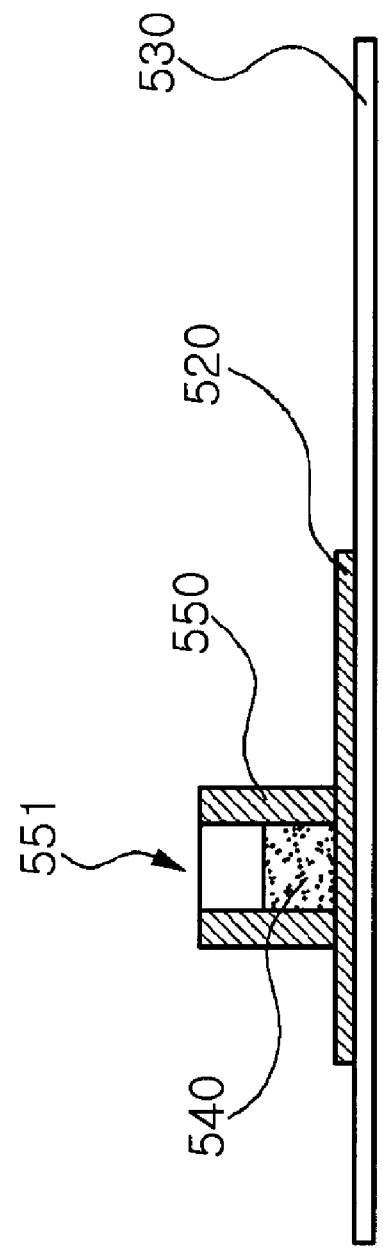

In FIG. 5B, a conductive via 550 that is connected to the conductive pattern 520 formed on the carrier film 530 is formed.

Conductive epoxy 540 may be used to connect the conductive via 550 to the conductive pattern 520. In this embodiment, the conductive via 550 may have a cylindrical shape having an opening 551. Therefore, when the opening 551 is filled with the conductive epoxy 540, the conductive epoxy 540 is cured and adheres to each of the conductive via 550 and the conductive pattern 520. The conductive epoxy 540 can provide a stable connection between the conductive via 550 and the conductive pattern 520. Here, when the conductive epoxy 540 fills the opening 550, the conductive epoxy 540 may partially fill the opening 550. The conductive via 550 may be in direct contact to the conductive pattern 520 or be connected to the conductive pattern 520 through the conductive epoxy 540.

The conductive via may have various shapes, and be simply formed into a conductive line. Here, conductive epoxy that is in contact with each of the conductive via and the conductive pattern is used to enhance a connection between the conductive via and the conductive pattern.

In FIG. 5C, the carrier film having the conductive pattern formed thereon and the conductive via, connected to the conductive pattern, formed therein are inserted into the mold for manufacturing the case of the mobile communication terminal, and a molding material is injected into the mold, thereby manufacturing a case body of the terminal.

Referring to FIG. 5C, the carrier film 530 having the conductive pattern 520 formed thereon and the conductive via 550 formed therein may be inserted into the mold 560. The mold 560 may include a first part 561, a second part 562, and a third part 563. The first part 561 is in contact with the carrier film 530 and forms a lower surface of the mold. A molding material is injected into the second part 562, which forms an upper surface of the mold. The third part 563 is connected to a storage unit containing the molding material. The carrier film 530 is inserted between the first part 561 and the second part 562 of the mold. The conductive pattern 520 formed on the carrier film may be disposed in direct contact with the molding material during the molding process.

All of the components are coupled with each other. The molding material is injected into the mold 560 though a nozzle under a predetermined pressure. The molding material may be a polymer-based material to manufacture the case of the terminal. The molding material injected into the mold fills space between the second part 562 and the first part 561 of the mold.

FIG. 5D is a cross-sectional view illustrating a case body 510 of a mobile communication terminal. A cooling process and a curing process are performed after a compressing process of the mold 560, such that the case body 510 of the mobile communication terminal has the conductive pattern 520 formed on one surface thereof and the conductive via 550, connected to the conductive pattern 520, formed therein can be manufactured.

In this embodiment, the method of manufacturing the case of the mobile communication terminal may further include filling the opening 551 of the conductive via with conductive epoxy. When the conductive via 550 has a cylindrical shape having the opening like this embodiment, an additional process of filling the opening 551 with the conductive epoxy 540 may be performed.

As set forth above, according to exemplary embodiments of the invention, a mobile communication terminal case that can provide a stable electrical connection between an antenna pattern formed on the outside of the mobile communication terminal case and a circuit board disposed inside the case, and prevent deformation of the antenna pattern can be obtained.

While the present invention has been shown and described in connection with the exemplary embodiments, it will be apparent to those skilled in the art that modifications and variations can be made without departing from the spirit and scope of the invention as defined by the appended claims.

What is claimed is:

1. A mobile communication terminal case comprising:
   a case body of a mobile communication terminal having a first surface and a second surface opposite to the first surface, and a via hole formed through the first surface and the second surface;
   a conductive pattern provided on the first surface of the case body;
   a carrier film provided on the first surface of the case body to cover the conductive pattern; and
   conductive epoxy filling the via hole and having one end thereof in contact with the conductive pattern.

2. The mobile communication terminal case of claim 1, further comprising a conductive via provided in the via hole and in contact with the conductive epoxy.

3. The mobile communication terminal case of claim 2, wherein the conductive via comprises a cylindrical shape having an opening therein.

4. The mobile communication terminal case of claim 2, wherein the conductive via is in direct contact with the conductive pattern.

5. A method of manufacturing a mobile communication terminal case, the method comprising:
   forming a conductive pattern on a carrier film;
   locating the carrier film having the conductive pattern formed thereon inside a mold shaped like a mobile communication terminal case, and injecting a molding material into the mold to form a case body of the mobile communication terminal having the conductive pattern formed on one surface thereof and a via hole connected to the conductive pattern; and
   injecting conductive epoxy into the via hole of the case body of the mobile communication terminal.

6. The method of claim 5, further comprising forming a conductive via in the via hole before injecting the conductive epoxy.

7. The method of claim 6, wherein the conductive via comprises a cylindrical shape having an opening therein.

8. A method of manufacturing a mobile communication terminal case, the method comprising:
   forming a conductive pattern on a carrier film;
   connecting a conductive via to the conductive pattern by using conductive epoxy; and
   locating the carrier film having the conductive pattern and the conductive via connected to the conductive pattern inside a mold shaped like a mobile communication terminal case, and injecting a molding material into the mold to form a case body of the mobile communication terminal,
   wherein the conductive pattern is formed on one surface of the case body of the mobile communication terminal, and the conductive via having one end connected to the conductive pattern is exposed to the other surface of the case body of the mobile communication terminal.

9. The method of claim 8, wherein the conductive via comprises a cylindrical shape having an opening therein.

10. The method of claim 9, further comprising filling the opening of the conductive via with conductive epoxy after forming the case body of the mobile communication terminal.

* * * * *